(12) United States Patent
Zhu et al.

(10) Patent No.: US 12,095,474 B1
(45) Date of Patent: Sep. 17, 2024

(54) USING MULTIPLE ERROR CORRECTION CODE DECODERS TO STORE EXTRA DATA IN A MEMORY SYSTEM

(71) Applicant: Synopsys, Inc., Mountain View, CA (US)

(72) Inventors: Jun Zhu, San Jose, CA (US); Biswanath Tayenjam, Bangalore (IN)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/146,026

(22) Filed: Dec. 23, 2022

Related U.S. Application Data

(60) Provisional application No. 63/306,464, filed on Feb. 3, 2022.

(51) Int. Cl.
*H03M 13/03* (2006.01)
*H03M 13/37* (2006.01)

(52) U.S. Cl.
CPC .......... *H03M 13/03* (2013.01); *H03M 13/37* (2013.01)

(58) Field of Classification Search
CPC .............................. H03M 13/03; H03M 13/37
See application file for complete search history.

(56) References Cited

U.S. PATENT DOCUMENTS

| | | | |
|---|---|---|---|
| 2019/0155685 A1* | 5/2019 | Kim | G06F 11/1048 |
| 2021/0311831 A1* | 10/2021 | Choi | G06F 3/0661 |
| 2021/0311868 A1* | 10/2021 | Chen | G11C 11/5628 |

* cited by examiner

*Primary Examiner* — Samir W Rizk
(74) *Attorney, Agent, or Firm* — Fenwick & West LLP

(57) ABSTRACT

Disclosed is a configuration to store metadata using an error correction code (ECC). The configuration receives at an ECC encoder of a memory controller, write data and an N-bit metadata, N comprising an integer greater than 0. The configuration generates a meta symbol using the N-bit metadata and creates an enhanced write data, the enhanced write data comprising the write data and the meta symbol generated by the N-bit metadata. The configuration encodes the enhanced write data and meta symbol to generate a parity. It deletes the meta symbol to generate an output, the output comprising an enhanced codeword and writes the enhanced codeword to a memory.

20 Claims, 8 Drawing Sheets

| ECC Result | Decoder0 0-Error | Decoder0 1-Error | Decoder0 2-Error | Decoder0 UE (3 or more errors) |
|---|---|---|---|---|
| Decoder1 0-Error | UE | If (D_rd0==D_rd1) D_rd=D_rd1; meta_data_rd = 1'b1; 0_Error; Else UE | UE | UE |
| Decoder1 1-Error | If (D_rd0==D_rd1) D_rd=D_rd0; meta_data_rd = 1'b0; 0_Error; Else UE | UE | If (D_rd0==D_rd1) D_rd=D_rd1; meta_data_rd = 1'b1; 1_Error; Else UE | UE |
| Decoder1 2-Error | UE | If (D_rd0==D_rd1) D_rd=D_rd0; meta_data_rd = 1'b0; 1_Error; Else UE | UE | D_rd = D_rd1; meta_data_rd = 1'b1; 2_Error; |
| Decoder1 UE (3 or more errors) | UE | UE | D_rd = D_rd0; meta_data_rd = 1'b0; 2_Error; | UE |

*FIG. 6*

USING MULTIPLE ERROR CORRECTION CODE DECODERS TO STORE EXTRA DATA IN A MEMORY SYSTEM

CROSS REFERENCE TO RELATED APPLICATIONS

This application claims the benefit of U.S. Provisional Application No. 63/306,464, filed Feb. 3, 2022, the contents of which is incorporated by reference in its entirety.

TECHNICAL FIELD

The present disclosure relates to memory systems and storage of metadata within memory systems.

BACKGROUND

In a dynamic data rate (DDR) memory system, there are read and write operations. A write operation of a DDR memory system enables an error correction code (ECC) encoder to encode the user data and generate parities. Data and parities together are called ECC Code Word (CW). The CW is written in dynamic random access memories (DRAMs).

A read operation of a DDR memory system is that a CW is read from DRAMs, and ECC decoder will decode the CW, data and parities. After correcting the errors, the corrected data will be returned to system. For example, in a 9×4 DDR system, there are nine (9) 4-bit DRAMs. Reed-Solomon (RS) code, e.g., RS (36,32) code, is used as ECC code in the system. Each CW consists of 32 bytes of data and 4 bytes of parities. In total, a 36-byte CW is stored in DRAM. This ECC can correct 2 byte-errors and detect 3 or more byte-errors. In this case, all DRAM storage is used to store data and ECC parities. For example, metadata can be 1 bit per 32 bytes of system data. Hence, in a 9×4 DDR system with RS(36,32) code ECC, there is no more DRAM storage for the metadata.

SUMMARY

The disclosed configurations include a system (and a method and computer readable storage medium) for storing metadata using an error correction code (ECC). In one example embodiment, the system receives at an ECC encoder of a memory controller, write data and an N-bit metadata. N is an integer greater than 0. The system generates a meta symbol using the N-bit metadata and creates an enhanced write data. The enhanced write data includes the write data and the meta symbol generated by the N-bit metadata. The system encodes the enhanced write data and meta symbol to generate a parity. The system deletes the meta symbol to generate an output that is an enhanced codeword, which is written a memory. The enhanced codeword may comprise the write data and the parity based on the meta symbol and write data.

On the decoding side, the system is structured to have a corresponding number of decoders depending on the N-bit metadata. In general, for every N-bits of metadata, there are $2^N$ decoders. For example, when N is one-bit, there may be two decoders. When N is two bits, there are 4 decoders.

In an example of one-bit metadata, the system includes a first decoder and a second decoder. The first decoder adds a first meta symbol to the enhanced codeword to generate a first augmented codeword. The second decoder adds a second meta symbol to the enhanced codeword to generate a second augmented codeword. The first decoder decodes the first augmented codeword and corrects errors for a first decoded data. The second decoder decodes the second augmented codeword and corrects errors for a second decoded data.

By way of example, if the first decoded data has one error and the second decoded data has zero error, the system extracts from the second meta symbol the one-bit metadata information associated with write data. If the first decoded data has zero error and the second decoded data has one error, the system extracts from the first meta symbol the one-bit metadata information associated with write data. If the first decoded data has two errors and the second decoded data has one error, the system extracts from the second meta symbol the one-bit metadata information associated with write data. If the first decoded data has one error and the second decoded data error has two errors, the system extracts from the first meta symbol the one-bit metadata information associated with write data. If the first decoded data has three or more errors and the second decoded data has two errors, the system extracts from the second meta symbol the one-bit metadata information associated with write data. If the first decoded data has two errors and the second decoded data error has three or more errors, the system extracts from the first meta symbol the one-bit metadata information associated with write data.

Accordingly, the disclosed system advantageously stores extra metadata without occupying memory storage and reduces ECC code aliasing. The disclosed configuration encodes metadata in ECC parities but stores system data and ECC parities in memory. Multiple decoders may be used to decode the read data and recover metadata by processing the ECC results from the multiple decoders. Accordingly, the disclosed configuration provides for storage of metadata information without a need to enlarge memory storage.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 6 illustrates an example truth table corresponding to a number of errors of the first decoded data and the second decoded data.

DETAILED DESCRIPTION

Error correction code (ECC) is an important reliability, availability, and serviceability (RAS) feature of advanced double data rate (DDR) systems. There are many different types of ECC codes being used in DDR memory systems, e.g., Enhanced Hamming Code, Reed-Solomon Code, etc. data and ECC parities are stored in DRAM. To help maximize the ECC capability, the data and ECC parities use up DRAM storage.

In some systems, there are special requirements, e.g., security or performance, which require storage of extra information with the data. Such extra information can be called metadata (or meta data). For example, every 64 bytes of system data may have 2 bits of meta data. Unfortunately, there is no DRAM storage to store the meta data.

Disclosed is a system (and method as well as non-transitory computer readable storage medium with stored instructions) that provides a means of storing extra metadata without occupying dynamic random access memory (DRAM) storage. By way of example, in a 9×4 DDR system, comprised of nine, four bit DRAM, Reed-Solomon error correction codes may be used, e.g., RS(37,33), where a data size is 33 bytes and ECC is 4 bytes. There may be one-bit metadata for each codeword (CW) (37 bytes) if there are 2 decoders. There may be two-bits of metadata (or meta-data) for each CW if there are 4 decoders.

The disclosed configuration may store extra metadata without occupying DRAM storage, and ECC code aliasing can be reduced. The disclosed configuration encodes metadata in ECC parities but stores system data and ECC parities in DRAM. Multiple decoders may be used to decode the read data and recover metadata by processing the ECC results from the multiple decoders. Accordingly, the disclosed configuration provides for storage of metadata information without a need to enlarge DRAM storage.

By way of example, in a 9×4 DDR system, RS(37,33) may be used as ECC code. A one-bit meta data for each codeword (CW) (37 bytes) may be used if there are two parallel decoders. Similarly, two bits metadata for each CW may be used if there are 4 parallel decoders.

Figure 1:
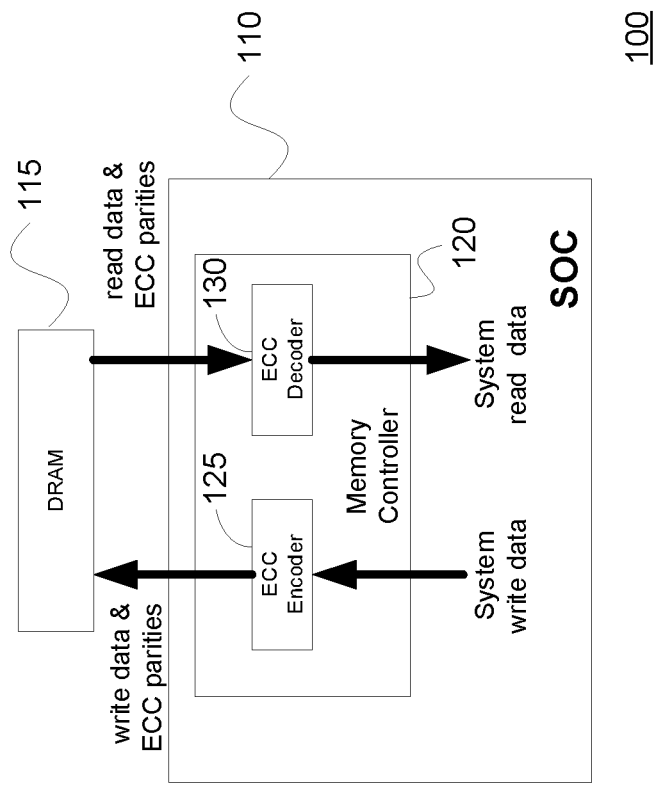
FIG. 1 illustrates an example double data rate system with a system on a chip (SOC) having a memory controller interfacing with a memory in accordance with an embodiment.

FIG. 1 illustrates an example double data rate (DDR) system 100 in accordance with an embodiment. The DDR system 100 includes a system on a chip (SOC) 110 and a memory 115, e.g., a dynamic random access memory (DRAM). The SOC 110 includes a memory controller 120. The memory controller 120 includes an error correction code (ECC) encoder 125 and an error correction code (ECC) decoder 130. The memory controller 120 interfaces with the memory 115, and more specifically, the ECC encoder 125 and ECC decoder 130 interface with the memory 115.

In the DDR system 100, the ECC encoder 125 of the SOC 110 memory controller 120 receives system write data. The system write data may come from other portions of the SOC 110, e.g., the central processing unit (CPU), graphics processing unit (GPU), direct memory access (DMA), and/or other interface modules, for example, peripheral component interface express (PCIe) and/or universal serial bus (USB). The ECC encoder 125 writes the data and ECC parities to the DRAM 115. The DDR system 100 also is configured to have the ECC decoder 130 of the SOC 110 memory controller 120 read data and ECC parities for a system read operation.

Figures 2A, 2B:
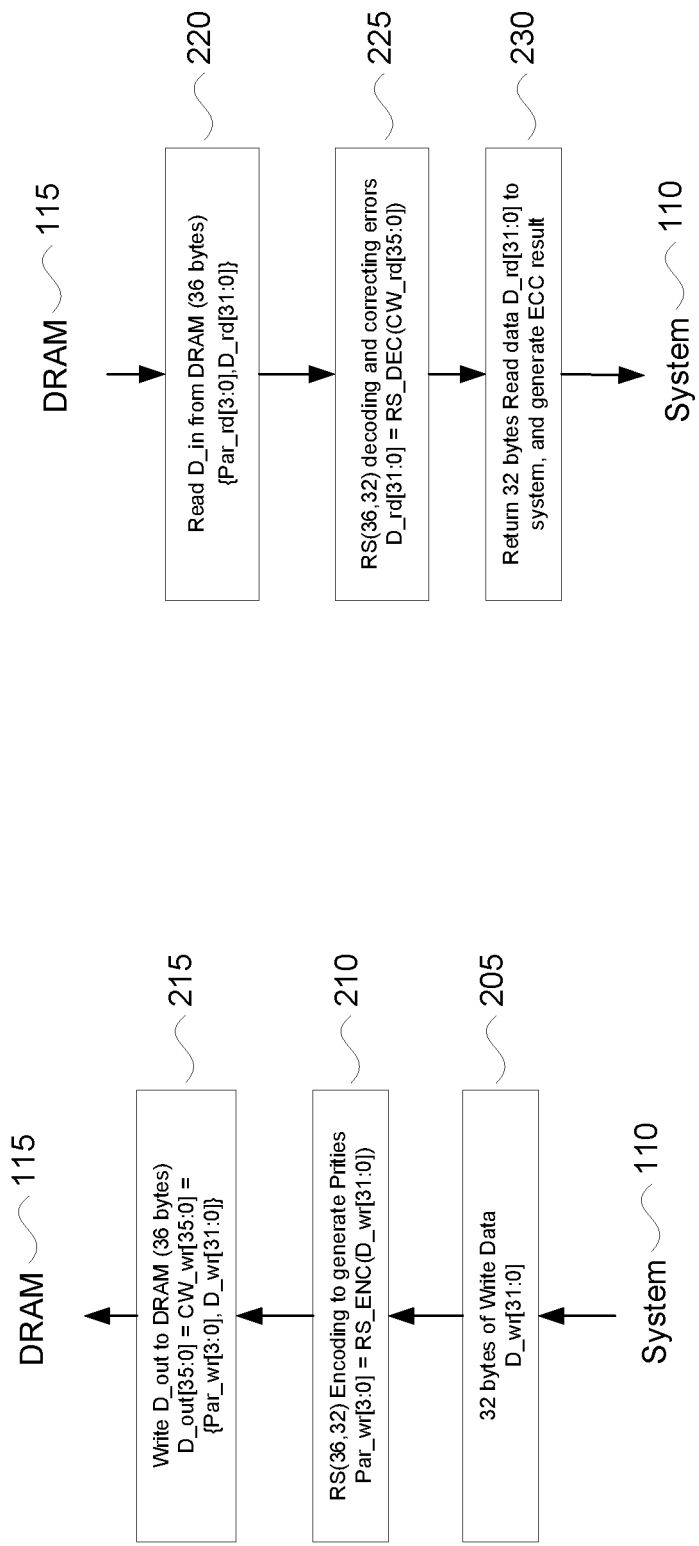
FIG. 2A illustrates an example RS(36,32) ECC encoding process in accordance with one embodiment.
FIG. 2B illustrates an example RS(36,32) ECC decoding process in accordance with one embodiment.

FIG. 2A illustrates an example of a conventional RS(36, 32) ECC encoding process during a system write operation in accordance with one embodiment. Here, the system writes 205 32 bytes of data, D_wr[31:0] to the ECC encoder 125 of the memory controller 125. The ECC encoder 125 encodes 210 the data to generate parities:

RS(36, 32); Par_wr[3:0]=RS_ENC(D_wr[31:0]).

The resulting encoded data is 36 bytes long. The ECC encoder 125 writes 215 the encoded data to the DRAM 115:

D_out[35:0]=CW_wr[35:0]={Par_wr[3:0]; D_wr[31:0]}.

FIG. 2B illustrates an example of a conventional RS(36, 32) ECC decoding process. The ECC decoder 130 of the memory controller 120 reads 220 the data, e.g., 36 bytes of data, from the DRAM:

D_in ={Par_rd[3:0]; D_rd[31:0]}.

The decoder 130 decodes 225 the read data and corrects the errors within it:

RS(36, 32): D_rd[31:0]=RS+DEC(CW_rd[35:0]).

Once decoded and corrected, the decoder 130 transmits, or returns, 230 32 bytes of the read data, D_rd[31:0], to the system and generates the ECC result.

A relationship between DRAM read data and DRAM write data can be described as following:

D_in[35:0]=D_out[35:0]+Errors

If the number of the Errors is 0, 1 or 2, all errors can be corrected by RS(36,32) ECC code. In this context, the ECC capability of RS(36,32) code can correct up to 2 errors in the 36 bytes codeword. As the result, D_rd[31:0] is equal to D_wr[31:0], where rd is a read and wr is a write. If the number of errors is greater than 2, the errors cannot be corrected by RS(36,32) ECC code. Where the error is greater than 2, an uncorrectable error (UE) will be detected by RS(36,32) decoder. Hence, there is no more DRAM storage to store metadata because a CW that has 36 bytes in total so that 32 bytes would be for SOC data and 4 bytes for ECC parities leaving no more room for metadata.

To address the scenario of two or more errors, the disclosed configuration uses a RS(37,33) code for an example 9×4 DDR system. Each codeword (CW) has 37 bytes, which includes:

D[31:0]: data symbols, 32 bytes of data
Meta: meta symbol, 1 byte for metadata
Par[3:0]: parity symbols, 4 bytes The above also may be described as CW[36:0]={Par[3:0], Meta[0], D[31:0]}

Figure 3:
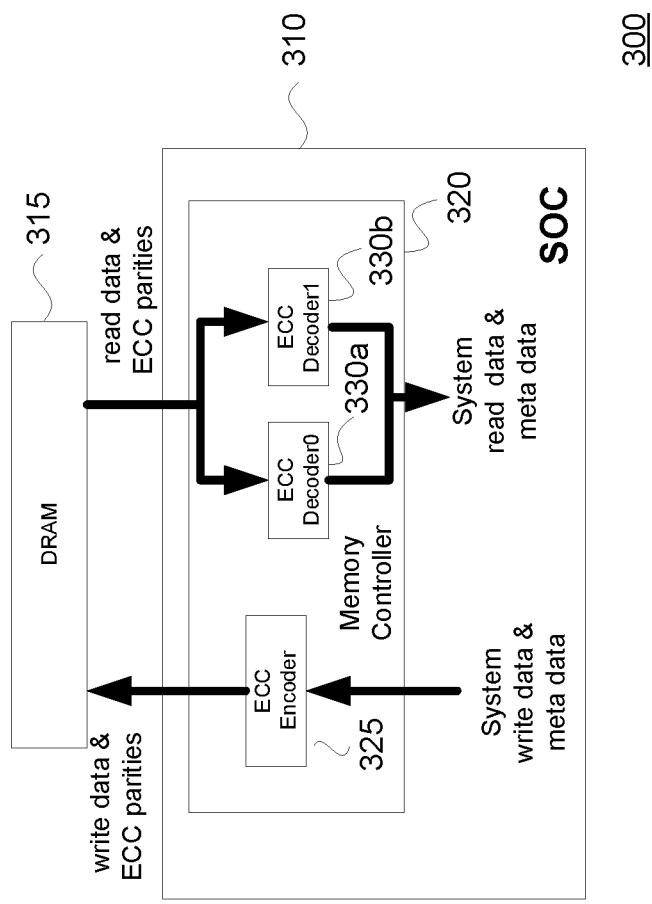
FIG. 3 illustrates a portion of an example system on a chip coupled with a memory in accordance with one embodiment.
Figure 7:
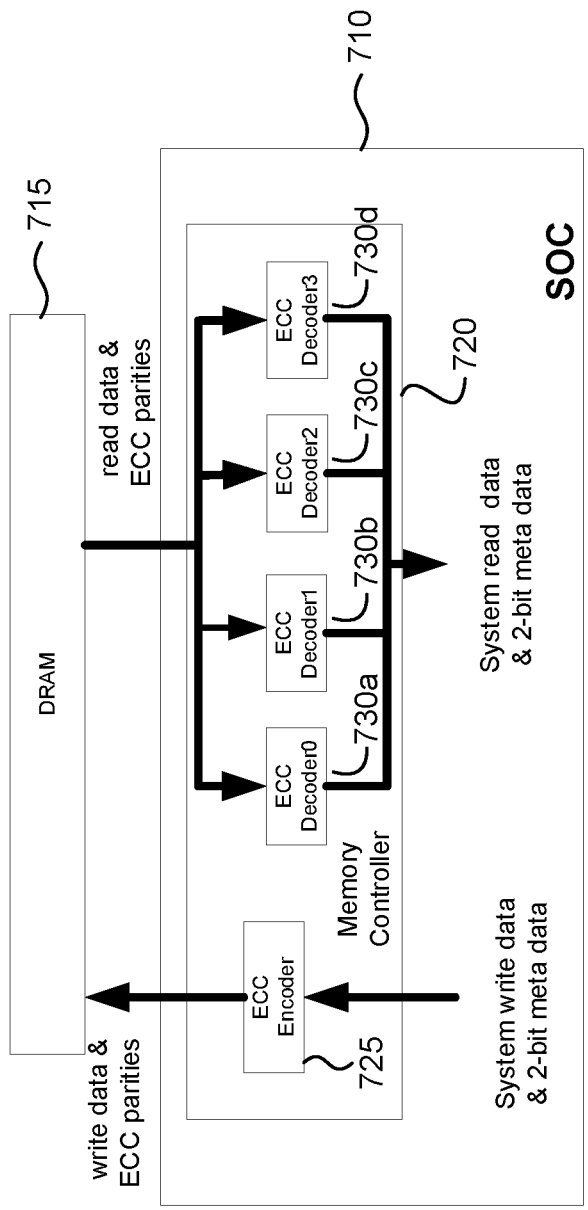
FIG. 7 illustrates an example of another SOC with a memory controller having one ECC encoder and four ECC decoders.

FIG. 3 illustrates a portion of an example SOC 310 coupled with a DRAM 315 in accordance with one embodiment. The SOC 310 includes a memory controller 320. The memory controller 320 includes an ECC encoder 325 and at least two decoders 330, a first ECC decoder 330a, e.g., ECC decoder0, and a second ECC decoder 330b, e.g., ECC decoder1. This configuration may support a one-bit metadata per codeword (CW). Referring to FIG. 7, it illustrates an example of a SOC 710 coupled with a memory, e.g., DRAM, 715. The SOC 710 includes a memory controller 715 having one ECC encoder 725 and four ECC decoders, generally 730, (e.g., decoder0 730a, decoder1 730b, decoder2 730c, and decoder3 730c). In the example of FIG. 7 with four ECC decoders 730 in the memory controller 720, each CW may have up to 2 bits of metadata. If there is 4 GB DDR storage in the system, with 4 ECC decoders, the system, e.g., SOC 110, may have 32 MB extra virtual storage for meta data. In general, if there are 2^N decoders in the memory controller, each CW can have up to N bits of metadata (N being an integer value).

In the example configuration of FIG. 3 and FIG. 7, to carry the metadata of a CW, a meta symbol is defined. Followings are examples of the function META_GEN:

Meta Symbol=META_GEN (meta_data_wr)

In the case of one-bit metadata per CW, the meta symbol may be defined as follows:

If meta data=1'b0, Meta Symbol=Meta0, e.g., 8'h00
If meta data=1'b1, Meta Symbol=Meta1, e.g., 8'h01

Meta0 and Meta1 have different values. In the case of 2-bit meta data per CW, the Meta symbol can be defined as follows:

If meta data=2b00, Meta Symbol:=Meta0, e.g., 8'h00
If meta data=2'b01, Meta Symbol=Meta1, e.g., 8'h01
If meta data=2'b10, Meta Symbol=Meta2, e.g., 8'h02
If meta data=2'b11, Meta Symbol=Meta3, e.g., 8'h03

In this case Meta0, Meta1, Meta2 and Meta3 have different values.

Figure 4:
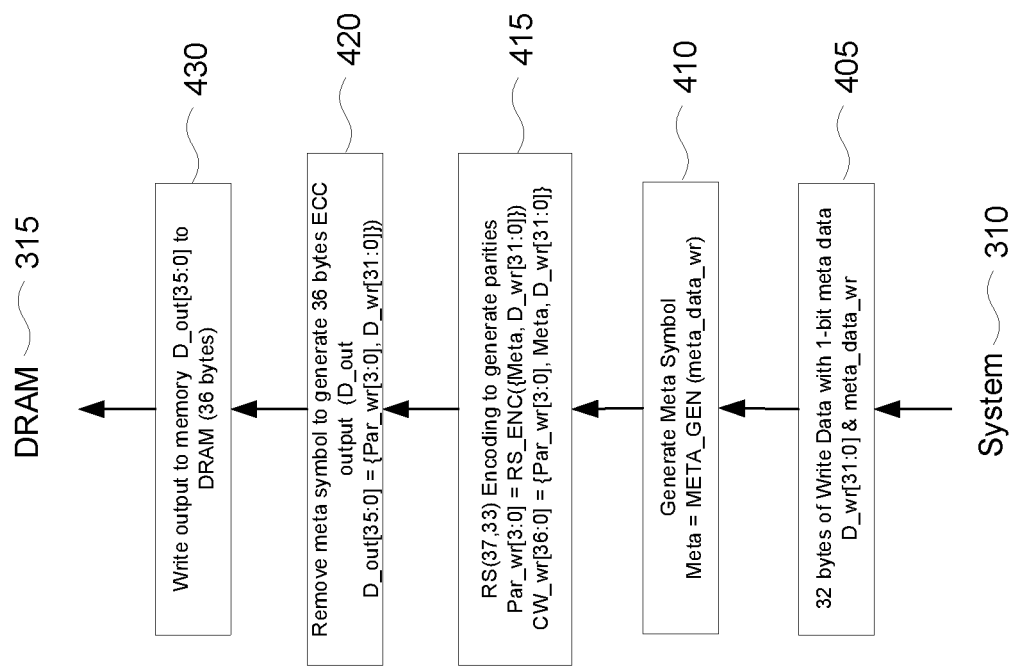
FIG. 4 illustrates an example encoding process in accordance with one embodiment.

Turning to FIG. 4, it illustrates an example encoding process for a system such as that illustrated and described with FIG. 3, thought the principles apply to the system shown in FIG. 7. The process starts with the encoder 325 of the memory controller 320 receiving 405 32 bytes of write data and a one-bit metadata: D_wr[31:0] and meta_data_wr. The process generates 410 a one-byte meta symbol using the one-bit metadata: Meta=META_GEN(meta_data_wr). The write data with one-byte meta symbol that is generated by one-bit metadata may be referred to as enhanced write data.

The ECC encoder 325 encodes 415 the enhanced write data to generate (or calculate) a parity for the codeword:

RS(37, 33): Par_wr[3:0]=RS_ENC{(Meta, D_wr[31:0]}) to generate
CW_wr[36:0]={Par_wr[3:0], Meta, D_wr[31:0]}.

The ECC encoder 325 removes 420 the meta symbol to generate an output that is 36 bytes of ECC output. Specifically, CW_wr[36:0]={Par_wr[3:0], Meta, D_wr[31:0]} so that there are 37 bytes. Metadata is dropped and only {Par_wr[3:0], D_wr[31:0]) will be written out to DRAM, which is D_out[35:0]:

D_out[35:0]=((Par_wr[3:0], D_wr[31:0]}).

The ECC encoder 325 writes 430 the output of 36 bytes to memory 315. The output may be referred to as an enhanced codeword that is the write data plus the parity based on the meta symbol and write data. The enhanced CW, whose ECC parity is now reflective of the metadata, is written to DRAM. In FIG. 4, note that when meta_data_wr=1'b0, Meta=Meta0 is encoded and when meta_data_wr=1'b1, Meta=Meta1 is encoded.

Figure 5:
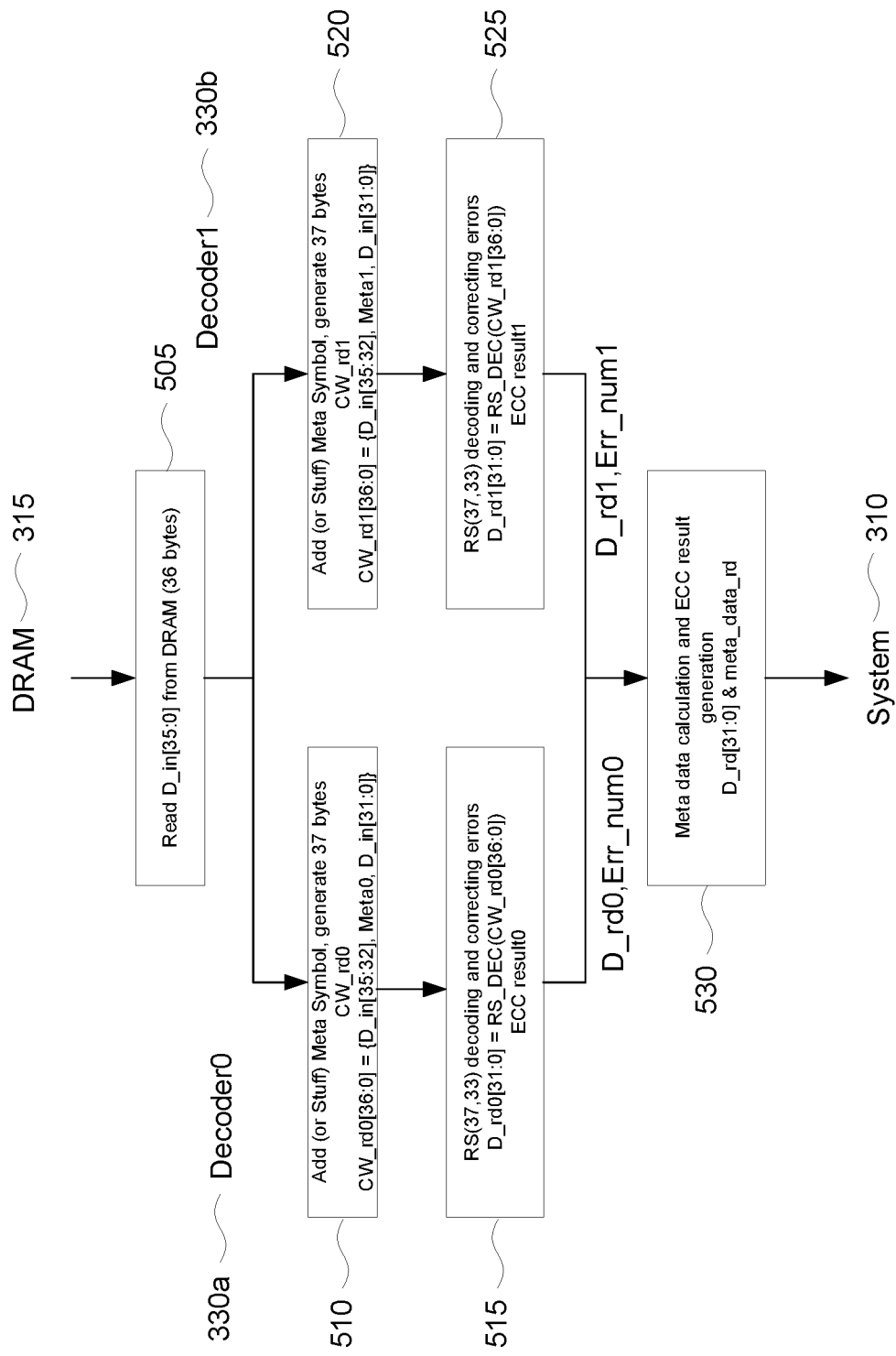
FIG. 5 illustrates an example decoder process in accordance with one embodiment.

FIG. 5 illustrates an example decoder process, for example, in a system as described and illustrated in FIG. 3. In this process, the memory controller 320 reads 505 the enhanced codeword CW, D_in[35:0], from the memory, e.g., DRAM, 315. The enhanced CW is transmitted to the first ECC decoder 325a, e.g., decoder0, and the second decoder 325b, e.g., decoder1. Each decoder, 325a, 325b, adds (or "stuffs") 510, 520 a meta symbol into the CW to generate an augmented codeword (or which is an augmented data string or stuffed data string) of 37 bytes. For example, the first decoder may add a first meta symbol, e.g., Meta0, to generate a first augmented codeword:

CW_rd[36:0]={D_in[35:32], Meta0, D_in[31:0]} and the second decoder may add a second meta symbol, e.g., Meta1, to generate a second augmented codeword:

CW_rd[36:0]={D_in[35:32], Meta1, D_in[31:0]}.

With the added meta symbol to the CW, each decoder 320a, 320b decodes 515, 525 its respective augmented codeword and corrects errors to generate, respectively, a first decoded data:

D_rd0,Err_num0 and a second decoded data:

D_rd0,Err_num0.

The process calculates 530 metadata and generates an ECC result based on the two decoded data and to determine which decoded data to transmit to the system:

D_rd[31:0] and metadata_rd.

More specifically, the process compares a number of errors of the first decoded data and the second decoded data using the truth table illustrated in FIG. 6.

FIG. 6 illustrates and example truth table corresponding to a number of errors of the first decoded data and the second decoded data described in FIG. 5. In FIG. 6, the top row illustrates the first decoder (decoder0) 320a output and number of errors and the left column illustrates the second decoder (decoder1) 320b output and number of errors. In the chart, an uncorrectable error is designated UE. Within the chart, an intersection of the output errors from the first decoder 320a and the second decoder 320b indicating a UE means the decoded output has an unrecoverable error. At other intersections that do not indicate a UE, the output calculates the particular metadata and generated ECC result. Specifically, the codeword CW_rd0 from first decoder, decoder0, 320a and codeword CW_rd1 from the second decoder, decoder1, 320b have only one symbol difference and one error difference. When meta_data_wr=Meta0, CW_rd1 has one more errors than CW_rd0 does and when meta_data_wr=Meta1, CW_rd0 has one more error than CW_rd1 does. As this is a fact instead of condition, the fact is used to calculate metadata in reverse direction on decoding side, e.g. if CW_rd1 has one more errors than CW_rd0 does, thereby allowing for conclusion of meta_data_wr=Meta0.

The pseudo code below sets forth the metadata calculation algorithm. The first decoder 320a is decoder 0 and the second decoder 320b is decoder1.

Decoder0 results are D_rd0 and Err_num0. Decoder1 results are D_rd1 and Err_num1.
if ((Err_num0=0) and (Err_num1=1) and (D_rd0=D_rd1))
  meta_data_rd=0, D_rd=D_rd0, Err_num=0;
else if ((Err_num0=1) and (Err_num1==0) and (D_rd0=D_rd1))
  meta_data_rd=1, D_rd=D_rd1, Err_num=0;
else if ((Err_num0=1) and (Err_num1=2) and (D_rd0=D_rd1))
  meta_data_rd=0, D_rd=D_rd0. Err_num=1;
else if ((Err_num0=2) and (Err_num1=1) and (D_rd0=D_rd1))
  meta_data_rd=1, D_rd=D_rd1. Err_num=1;
else if ((Err_num0=2) and (Err_num1>=3))
  meta_data_rd=0, D_rd=D_rd). Err_num=2;
else if ((Err_num0>=3) and (Err_num1=2))
  meta_data_rd=1, D_rd=D_rd1, Err_num=2;
else
  UE (Uncorrectable Error)

By using multiple ECC decoders 320a, 320b and parallel decoding method, the ECC code may be used to carry extra data in memory systems. Each ECC codeword (CW) can carry N-bit of extra data if there are 2^N ECC decoders in the system.

By using multiple ECC decoders and parallel decoding method, ECC code may be used to carry extra data in memory systems. Each ECC Code Word can carry N-bit of extra data if there are 2^N ECC decoders in the system. The disclosed configuration (system and method) may apply to RS code as well as other ECC codes. Further, the disclosed configuration may apply to DDR memory as well as other memory systems that have ECC.

Example Computing or Machine Architecture

Figure 8:
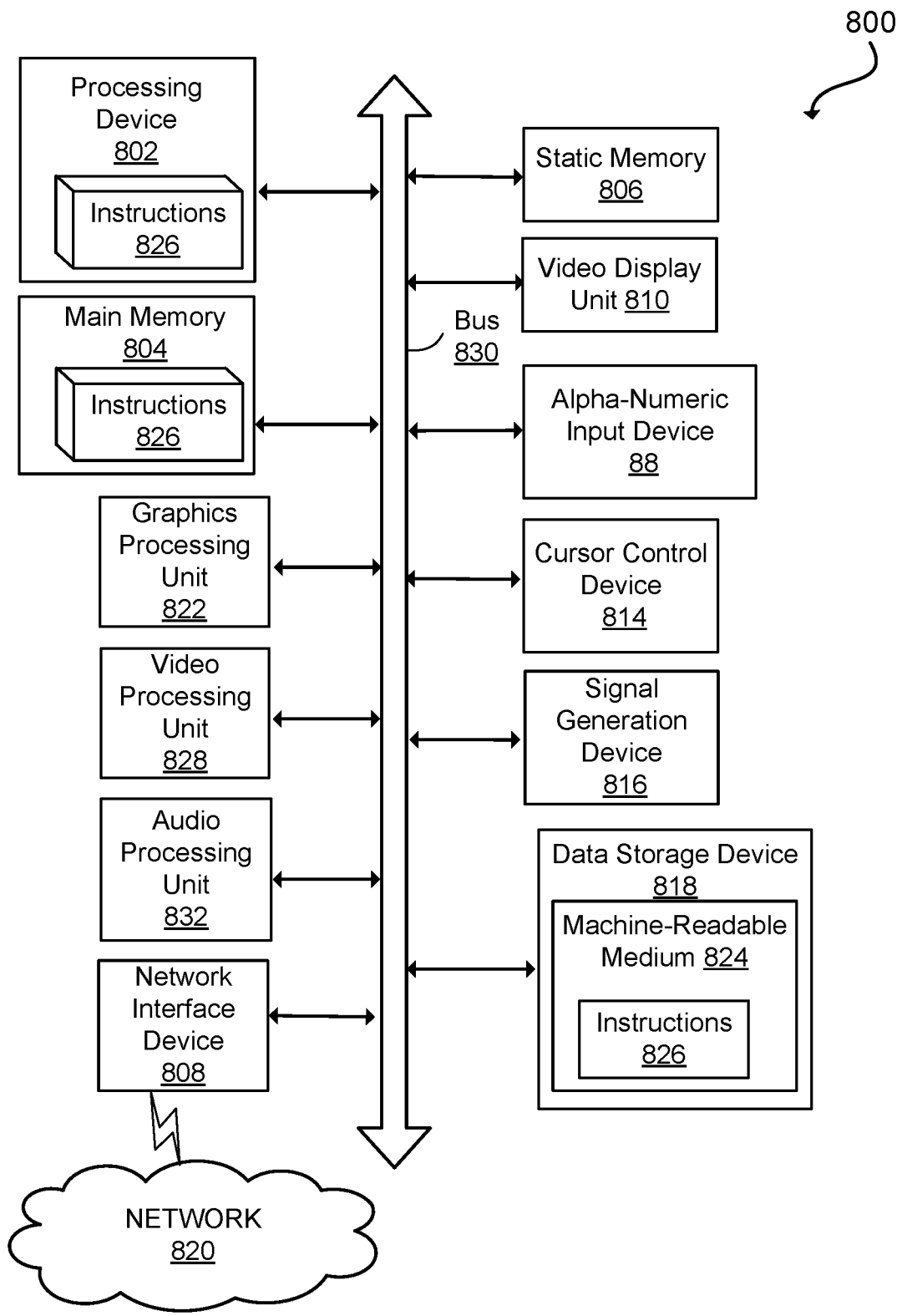
FIG. 8 depicts an abstract diagram of an example computer system in which embodiments of the present disclosure may operate.

FIG. 8 illustrates an example machine of a computer system 800 within which a set of instructions, for causing the machine to perform any one or more of the methodologies (or processes) for encoding and/or decoding discussed herein. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for storing metadata using an error correction code (ECC), the method comprising:
    receiving at an ECC encoder of a memory controller, write data and an N-bit metadata, N comprising an integer greater than 0;
    generating a meta symbol using the N-bit metadata;
    creating enhanced write data by combining the write data and the meta symbol;
    generating a parity based on the enhanced write data;
    generating a codeword by combining the enhanced write data and the parity;
    generating an enhanced codeword by deleting the meta symbol from the codeword; and
    writing the enhanced codeword to a memory.

2. The method of claim 1, wherein N-bit metadata is one-bit metadata and the enhanced codeword comprises the write data and the parity based on the meta symbol and write data and wherein the memory transmits the enhanced codeword to a first decoder and a second decoder.

3. The method of claim 2, wherein the first decoder adds a first meta symbol to the enhanced codeword to generate a first augmented codeword and the second decoder adds a second meta symbol to the enhanced codeword to generate a second augmented codeword.

4. The method of claim 3, wherein the first decoder decodes the first augmented codeword and corrects errors for a first decoded data and the second decoder decodes the second augmented codeword and corrects errors for a second decoded data.

5. The method of claim 4, wherein if the first decoded data has one error and the second decoded data has zero error, extracting from the second meta symbol the one-bit metadata information associated with write data.

6. The method of claim 4, wherein if the first decoded data has zero error and the second decoded data has one error, extracting from the first meta symbol the one-bit metadata information-associated with write data.

7. The method of claim 4, wherein if the first decoded data has two errors and the second decoded data has one error, extracting from the second meta symbol the one-bit metadata information associated with write data.

8. The method of claim 4, wherein if the first decoded data has one error and the second decoded data has two errors, extracting from the first meta symbol the one-bit metadata information associated with write data.

9. The method of claim 4, wherein if the first decoded data has three or more errors and the second decoded data has two errors, extracting from the second meta symbol the one-bit metadata information associated with write data.

10. The method of claim 4, wherein if the first decoded data has two errors and the second decoded data has three or more errors, extracting from the first meta symbol the one-bit metadata information associated with write data.

11. A non-transitory computer-readable storage medium comprising stored instructions for storing metadata using an error correction code (ECC), the instructions when executed by least one processor causes at least one processor to:
    receive at an ECC encoder of a memory controller, write data and an N-bit metadata, N comprising an integer greater than 0;
    generate a meta symbol using the N-bit metadata;
    create enhanced write data by combining the write data and the meta symbol;
    generate a parity based on the enhanced write data;
    generate a codeword by combining the enhanced write data and the parity;
    generate an enhanced codeword by deleting the meta symbol from codeword; and
    write the enhanced codeword to a memory.

12. The non-transitory computer-readable storage medium of claim 11, wherein N-bit metadata is one-bit metadata and the enhanced codeword comprises the write data and the parity based on the meta symbol and write data.

13. The non-transitory computer-readable storage medium of claim 12, further comprising stored instructions that when executed causes the at least one processor to:
    receive from the memory the enhanced codeword at a first decoder and a second decoder;
    instruct the first decoder to add a first meta symbol to the enhanced codeword to generate a first augmented codeword; and
    instruct the second decoder to add a second meta symbol to the enhanced codeword to generate a second augmented codeword.

14. The non-transitory computer-readable storage medium of claim 13, further comprising stored instructions that when executed causes the at least one processor to:
    instruct the first decoder to decode the first augmented codeword and correct errors for a first decoded data; and
    instruct the second decoder to decode the second augmented codeword and correct errors for a second decoded data.

15. The non-transitory computer-readable storage medium of claim 14, further comprising stored instructions that when executed causes the at least one processor to:
    extract from the second meta symbol the one-bit metadata associated with write data if the first decoded data has one error and the second decoded data has zero error.

16. The non-transitory computer-readable storage medium of claim 14, further comprising stored instructions that when executed causes the at least one processor to:
    extract from the first meta symbol the one-bit metadata associated with write data wherein if the first decoded data has zero error and the second decoded data has one error.

17. The non-transitory computer-readable storage medium of claim 14, further comprising stored instructions that when executed causes the at least one processor to:

extract from the second meta symbol the one-bit metadata associated with write data wherein if the first decoded data has two errors and the second decoded data has one error.

18. The non-transitory computer-readable storage medium of claim 14, further comprising stored instructions that when executed causes the at least one processor to:
   extract from the first meta symbol the one-bit metadata associated with write data wherein if the first decoded data has one error and the second decoded data has two errors.

19. The non-transitory computer-readable storage medium of claim 14, further comprising stored instructions that when executed causes the at least one processor to:
   extract from the second meta symbol the one-bit metadata associated with write data wherein if the first decoded data has three or more errors and the second decoded data has two errors.

20. The non-transitory computer-readable storage medium of claim 14, further comprising stored instructions that when executed causes the at least one processor to:
   extract from the first meta symbol the one-bit metadata associated with write data wherein if the first decoded data has two errors and the second decoded data has three or more errors.

\* \* \* \* \*